(12) United States Patent
Anzai

(10) Patent No.: US 6,316,973 B1
(45) Date of Patent: Nov. 13, 2001

(54) TRANSMISSION TIMING ADJUSTING CIRCUIT AND METHOD

(75) Inventor: Takeshi Anzai, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/491,150

(22) Filed: Jan. 26, 2000

(30) Foreign Application Priority Data

Jan. 28, 1999 (JP) .................................................. 11-020553

(51) Int. Cl.[7] .......................................................... H03L 7/00
(52) U.S. Cl. ............................................ 327/144; 327/146
(58) Field of Search .................................. 327/141, 144, 327/145, 146, 147, 148, 149, 150, 152, 153, 155, 156, 157, 158, 159, 161

(56) References Cited

U.S. PATENT DOCUMENTS 5,550,860 * 8/1996 Georgiou et al. ..................... 375/220
5,646,519 * 7/1997 Hamilton et al. ..................... 327/158

* cited by examiner

*Primary Examiner*—Timothy P. Callahan
*Assistant Examiner*—Linh Nguyen
(74) *Attorney, Agent, or Firm*—Scully, Scott, Murphy & Presser

(57) ABSTRACT

On the basis of a reception clock, a transmission clock and a self-running clock having higher frequency than that of the reception clock, the phases of the reception clock and the transmission clock are compared. The phase of the transmission clock is controlled on the basis of the phase comparison circuit for outputting the controlled transmission clock and a frequency division clock of the self-running clock.

8 Claims, 5 Drawing Sheets

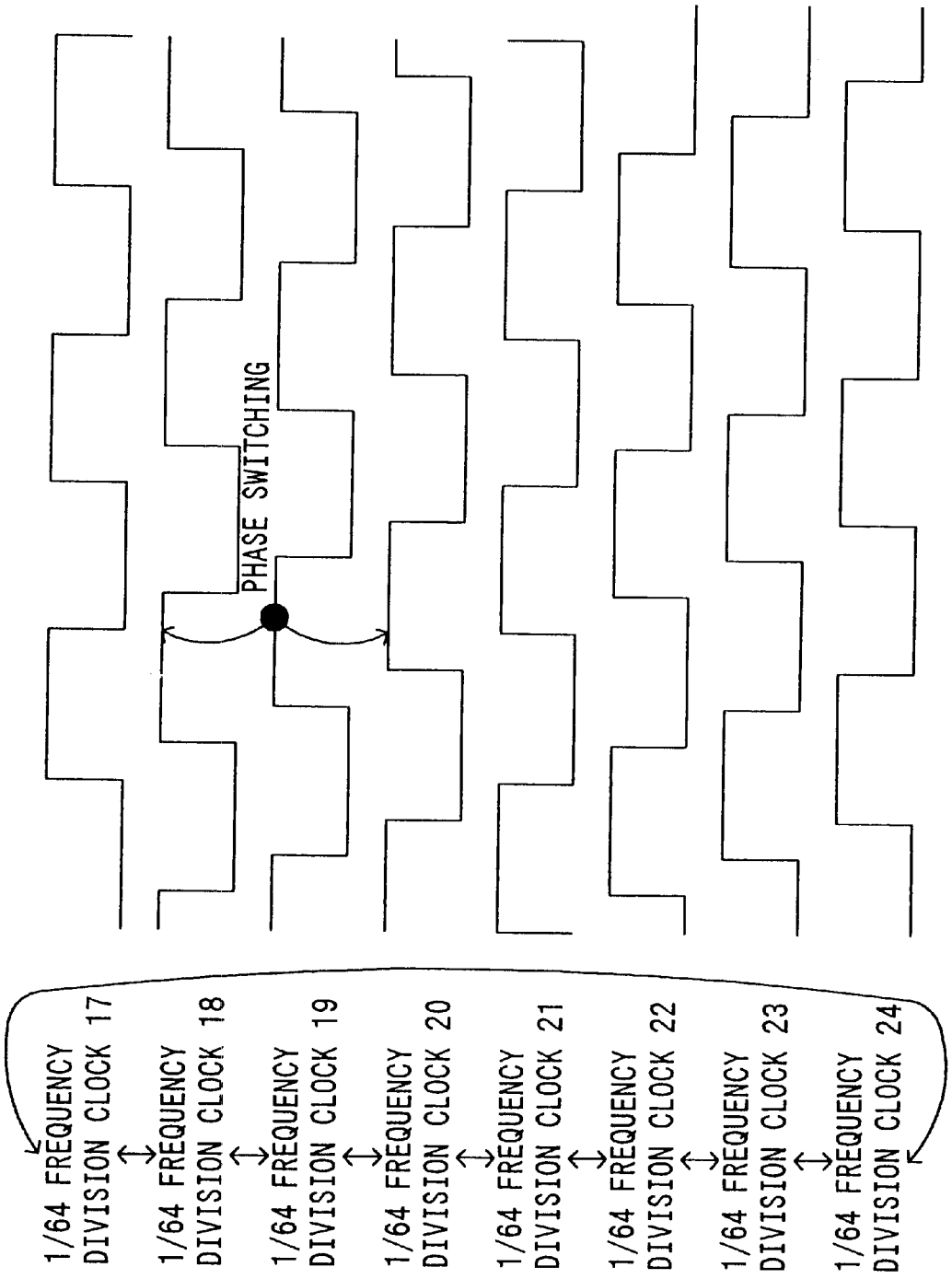

TRANSMISSION TIMING ADJUSTING CIRCUIT AND METHOD

BACKGROUND OF THE INVENTION

The present invention relates to transmission timing adjusting circuits and method, more particularly, to a transmission timing adjusting circuit, which comprises a phase comparison circuit for receiving a reception clock and a self-running clock and comparing the phases of the reception clock and a transmission clock, and a phase correction circuit for receiving the self-running clock and the output of the phase comparison circuit and outputting the transmission clock and a frequency division clock of the self-running clock.

In the prior art, when it is intended to use the reception clock directly as the transmission clock, it is necessary to synchronize the phase of the transmission clock for coping with phase deviation due to delay and sudden phase deviation. To this end, usually a clock is extracted from the received signal for discriminating frame synchronization, storing a digital signal and adjusting the read-out timing.

However, in RCR (Research & Development Center for Radio System, Electric Wave Development Center) -27F, which is digital system car telephone standards, the transmission clock should be controlled such that in one slot it will not be deviated by more than ⅛ symbol, and a method for doing so has been contemplated.

SUMMARY OF THE INVENTION

Accordingly, it is an object of the present invention, to prevent sudden deviation of the phase of the transmission clock in the event of reception clock phase deviation and further hold the inter-slot transmission timing within ⅛ symbol irrespective of reception timing deviation by ⅛ symbol or more, i.e., by two clock cycles of the transmission clock, in the slot.

According to an aspect of the present invention, there is provided a transmission timing adjusting circuit comprising a phase comparison circuit for receiving a reception clock, a transmission clock and a self-running clock and comparing the phases of the reception clock and the transmission clock, and a phase correction circuit for receiving the self-running clock and the output of the phase comparison circuit and outputting the transmission clock and a frequency division clock of the self-running clock; the frequency of the self-running clock being set to be higher than the frequency of the reception clock; the phase comparison circuit performing the phase comparison on the basis of the self-running clock, the frequency division clock and the transmission clock, and outputs the result of comparison; the phase correction circuit controlling the phase of the transmission clock according to the output of the phase comparison circuit.

The phase comparison circuit includes a first flip-flop for receiving the reception clock and the self-running clock and outputting a first internal clock, a second flip-flop for receiving the first internal clock and the frequency division clock and outputting a second internal clock, and a phase comparison decoder for the first and second internal clocks and the transmission clock and performing the phase comparison; a judgment being performed as to whether the reception clock is leading in phase, in phase with or lagging in phase behind the transmission clock, thereby providing a three-value comparison result signal indicative of one of three, i.e., leading, in-phase and lagging-behind, states.

The phase correction circuit includes a first frequency division circuit for receiving the self-running clock and outputting a first frequency division clock, a second frequency division circuit for receiving the self-running clock and outputting a second frequency division clock, a flip-flop group for generating a plurality of phase adjustment clocks equal in frequency to one another and different in phase from one another on the basis of the outputs of the first and second frequency division circuits, and a selector for receiving the plurality of phase adjustment clocks and selectively outputting one thereof; the first and second frequency division clocks being set in frequency to one another; one of the phase adjustment clocks being selected as a result of the phase comparison and outputted as the transmission clock.

The first and second frequency division clocks are at double the frequency of the frequency division clock.

The phase correction circuit starts the control according to a trigger signal.

The phase correction circuit includes an up-down counter for receiving the phase comparison result, the trigger signal and the transmission clock, and a delay means for delaying the output of the up-down counter; the up-down counter being caused to up-count the phase comparison result when the result is leasing phase data, being caused to down-count the result when the result is lagging phase data, and being held inoperative when the result is in-phase data; the selector selectively providing one of the phase adjustment clocks as the transmission clock according to the output of the delaying means.

The delay means is a flip-flop.

According to another aspect of the present invention, there is provided a transmission timing adjusting method comprising steps of: comparing, on the basis of a reception clock, a transmission clock and a self-running clock having higher frequency than that of the reception clock, the phases of the reception clock and the transmission clock; and controlling the phase of the transmission clock on the basis of the phase comparison circuit for outputting the controlled transmission clock and a frequency division clock of the self-running clock.

Other objects and features will be clarified from the following description with reference to attached drawings.

BRIEF DESCRIPTION OF THE DRAWINGS

FIG. 5 is a time chart for describing the operation of the phase correction circuit 2 shown in FIG. 1.

PREFERRED EMBODIMENTS OF THE INVENTION

Preferred embodiments of the present invention will now be described with reference to the drawings. In the following description, the frequency of self-running clock is 64 times that of the transmission clock is assumed.

Figure 1:
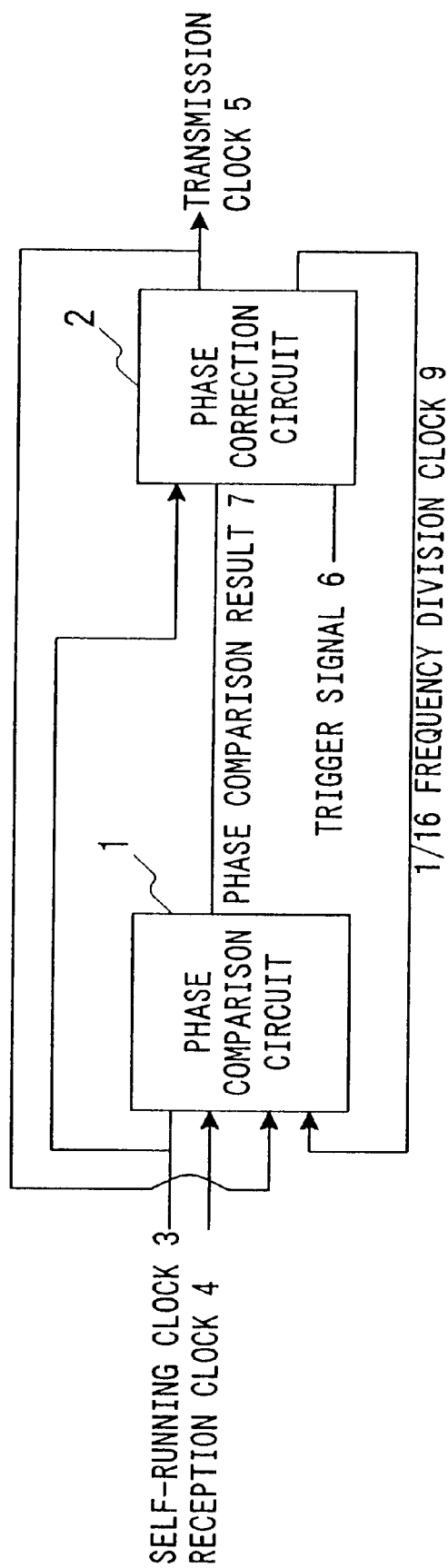
FIG. 1 is a block diagram showing a transmission timing adjusting circuit according to an embodiment of the present invention.

FIG. 1 is a block diagram showing a transmission timing adjusting circuit according to the present invention. A phase comparison circuit 1 compares the phases of a reception clock 4 and a transmission clock from a phase correction circuit 2. The phase comparison is performed by using two other clocks. One of these other clocks is a self-running clock, which is provided from a different clock source from the reception clock and at a frequency higher than the reception and transmission clocks and capable of being divided to the transmission clock frequency. The other one of the other clocks is a 1/16 frequency division clock 9 of the self-running clock 3.

A phase correction circuit 2 performs phase correction according to the result 7 of phase comparison in the phase comparison circuit 1. More specifically, the phase correction circuit 2 performs phase correction of the transmission clock with the self-running clock 3 and a trigger signal 6, and outputs a phase-corrected transmission clock 5.

Figure 2:
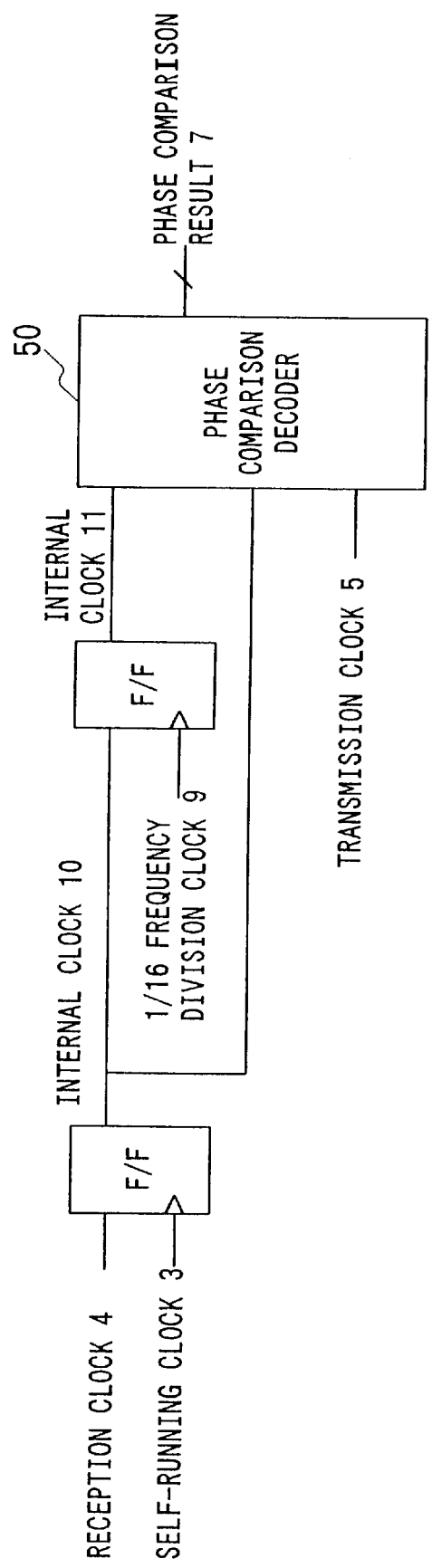
FIG. 2 is a block diagram showing the phase comparison circuit 1 shown in FIG. 1.

FIG. 2 is a block diagram showing the phase comparison circuit 1. The phase comparison circuit 1 generates an internal clock 10 from the reception clock 4 and the self-running clock 3. The phase comparison circuit 1 also generates an internal clock 11 from the internal clock 10 and the 1/16 frequency division clock 9. The internal clocks 10 and 11 and the phase-corrected transmission clock 5 are inputted to a phase comparison decoder 50, which thus outputs a phase comparison result 7.

Figure 3:
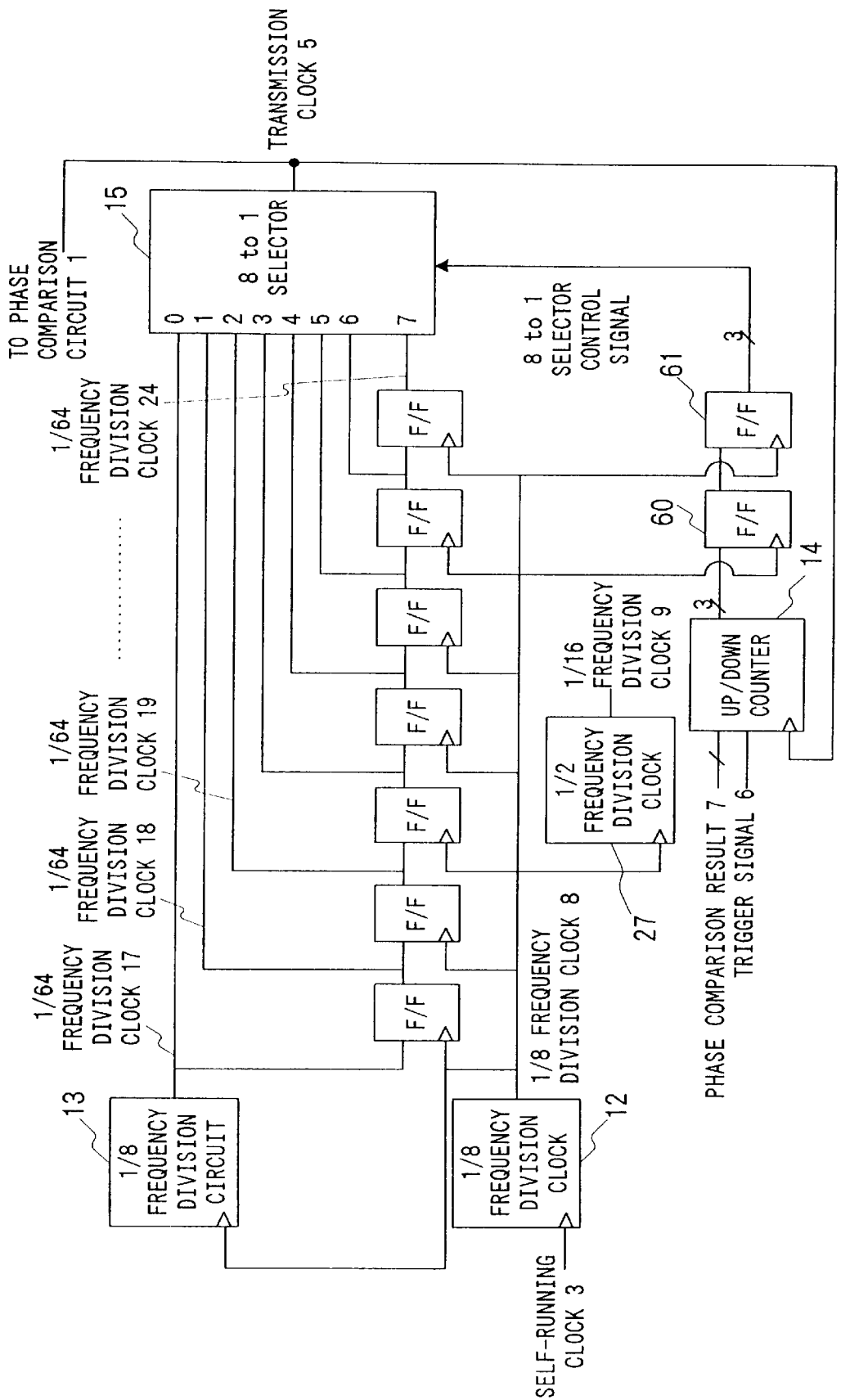
FIG. 3 is a block diagram showing the phase correction circuit 2 shown in FIG. 1.

FIG. 3 is a block diagram showing the phase correction circuit 2. A 1/8 frequency division circuit 12 generates a 1/8 frequency division clock 8 from the self-running clock 3. A 1/8 frequency division circuit 13 generates 1/64 frequency division clocks 17 to 24 from the 1/8 frequency division clock 8. An up/down counter 14 counts up or down the phase comparison result 7 at input timings of a phase correction trigger signal 6, and outputs an 8-to-1 selector control signal 26. An 8-to-1 selector 15 selectively outputs a phase-corrected clock as transmission clock 5 among the eight different 64 frequency division clocks.

Figure 4:
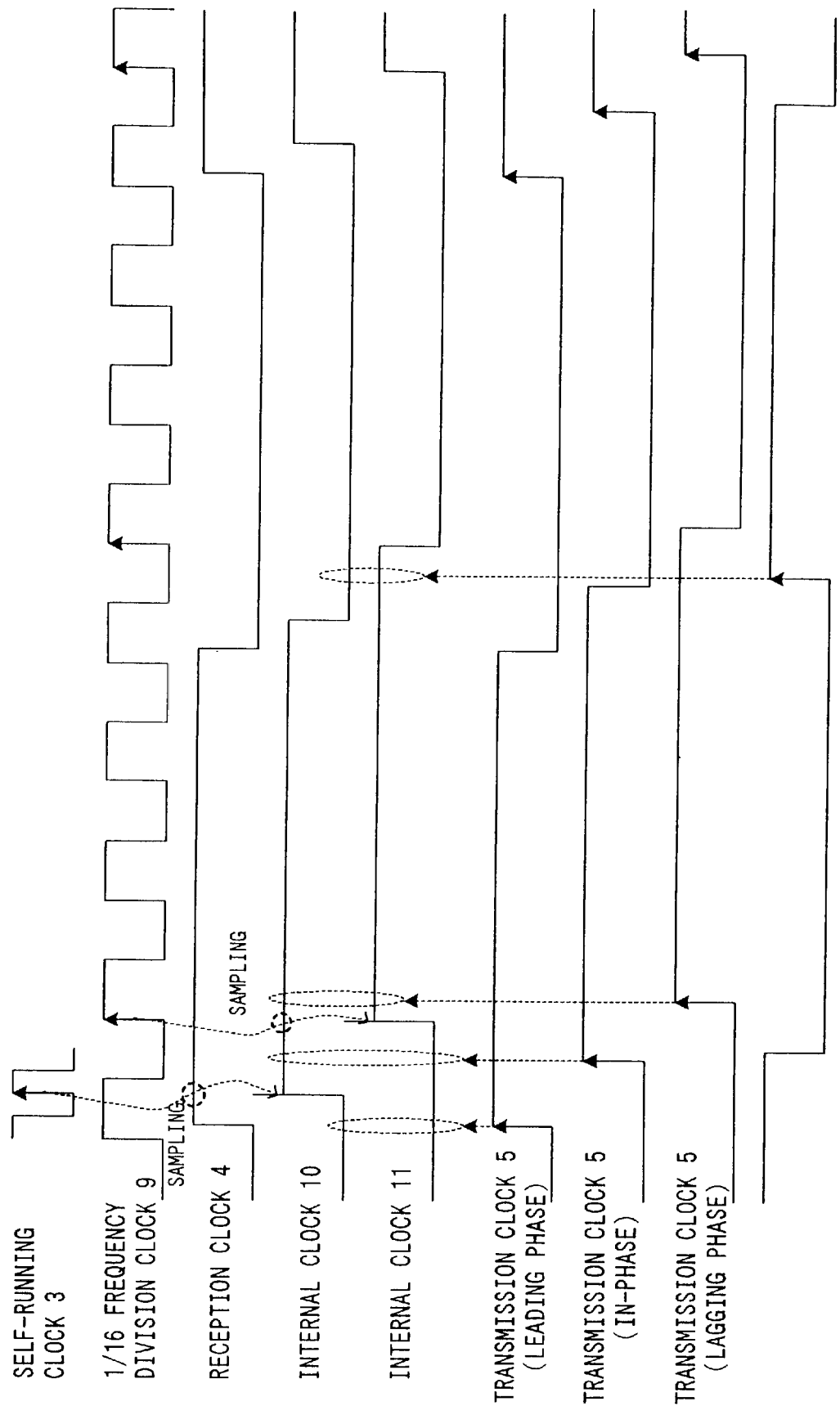
FIG. 4 is a time chart for describing the operation of the phase comparison circuit 1 shown in FIG. 1.

FIG. 4 is a time chart for describing the operation of the phase comparison circuit 1. The phase comparison circuit 1 checks the status of the internal clocks 10 and 11 at the timing of each rising edge of the transmission clock 5, and from the checked status it judges the phase relation of the transmission clock 5 to the reception clock 4.

Specifically, when the internal clocks 10 and 11 are both "L", the transmission clock 5 is leading in phase the reception clock 4, and the phase comparison circuit 1 judges as such. When the internal clocks 10 and 11 are "H" and "L", respectively, the transmission clock is in phase or synchronized with the reception clock 4, and the circuit 1 thus judges as such. When the internal clocks 10 and 11 are both "H", the transmission clock 11 is lagging in phase behind the reception clock 4, and the circuit 1 thus judges as such. When the internal clocks 10 and 11 are "L" and "H", respectively, the transmission clock 5 is again lagging in phase behind the reception clock, and the circuit 1 thus judges as such.

The leading, in-phase and lagging phase data thus judged is outputted as the phase comparison result 7 to the phase correction circuit 2.

FIG. 5 is a time chart for describing the operation the phase correction circuit 2. As shown in the Figure, when the self-running clock 3 is at 64 times the frequency of the transmission clock 5, the 1/8 frequency division circuit 12 generates the 1/8 frequency division clock 8. From this 1/8 frequency division clock 8, the 8 different 1/64 frequency division clocks are generated in a succeeding circuit. A 1/2 frequency division circuit 27 further generates a 1/16 frequency division clock 9. The 1/8 frequency division circuit 13 frequency divides the 1/8 frequency division clock by 8 to generate the 1/64 frequency division clock 17, and also generates the eight 1/64 frequency division clocks 18 to 24 of different phases from the 1/8 frequency division clock 8. The 8-to-1 selector 15 selectively outputs one of the 8 different 1/64 frequency division clocks as the transmission clock according to the designation of the 8-to-1 selector control signal 26. The 8-to-1 selector control signal 26 is generated in the up-down counter 14 on the basis of the phase comparison result 7 under control of the trigger signal 6. The 1/64 frequency division signal 24 is lagging in phase behind the 1/64 frequency division clock 17.

When the phase comparison result 7 is leading phase data, the phase of the transmission clock is retarded by causing up-counting of the up-down counter 14. When the phase comparison result 7 is lagging phase data, the phase of the transmission clock 5 is advanced by causing down-counting of the counter. When the phase comparison result 7 is in-phase data, neither the counter is operated, nor the phase of the transmission clock 5 is changed.

The phase switching is caused with, for instance, flip-flops (FF) 60 and 61 by using the rising edge of the previous clock, and it is caused after two clock pulses of the 1/8 frequency division clock to prevent the spike generation.

As shown above, by using a self-running clock at 64 times the transmission clock frequency it is possible obtain phase correction with an accuracy of the 1/8 frequency division clock.

While a preferred embodiment of the present invention has been described, this is by no means limitative, and it is possible to obtain phase correction in finer units by increasing the number of different phases prepared as the transmission clock in FIG. 3 with a self-running clock at a higher clock frequency.

The use of a self-running clock at a higher frequency also permits reduction of the time difference between the rising edges of the internal clock 10 and the reception clock 4. At the same time, this reduces the period of the 1/16 frequency division clock, thus permitting reduction of the time interval, which is judged to be an in-phase interval. With these advantages, it is possible to obtain phase comparison with higher accuracy.

As has been described in the foregoing, by correcting a deviation, if any, of the reception clock by 1/8 frequency division clock period at each given correction timing or phase follow-up, it is possible to prevent a sudden deviation of the transmission clock. This means that it is possible to hold the inter-slot transmission timing within 1/8 symbol even at the time of occurrence of a deviation of the reception timing beyond 1/8 symbol in one slot, as prescribed in RCR-27F, i.e., digital system car telephone standards. One symbol means two transmission clock cycles, and according to the present invention it is possible to obtain phase correction with an accuracy of 1/16 symbol. This is so because the phase correction of the transmission clock with respect to the reception clock is done at timings designated from the outside by using a clock from a separate clock source from the reception clock. Another reason is that the amount of correction in one correcting operation can be held within 1/8 symbol with a phase correction accuracy of 1/8 symbol or above as a unit.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A transmission timing adjusting circuit comprising a phase comparison circuit for receiving a reception clock, a transmission clock and a self-running clock and comparing the phases of the reception clock and the transmission clock, and a phase correction circuit for receiving the self-running clock and the output of the phase comparison circuit and outputting the transmission clock and a frequency division clock of the self-running clock;

the frequency of the self-running clock being set to be higher than the frequency of the reception clock;

the phase comparison circuit performing the phase comparison on the basis of the self-running clock, the frequency division clock and the transmission clock, and outputs the result of comparison;

the phase correction circuit controlling the phase of the transmission clock according to the output of the phase comparison circuit.

2. The transmission timing adjusting circuit according to claim 1, wherein:

the phase comparison circuit includes a first flip-flop for receiving the reception clock and the self-running clock and outputting a first internal clock, a second flip-flop for receiving the first internal clock and the frequency division clock and outputting a second internal clock, and a phase comparison decoder for the first and second internal clocks and the transmission clock and performing the phase comparison;

a judgment being performed as to whether the reception clock is leading in phase, in phase with or lagging inphase behind the transmission clock, thereby providing a three-value comparison result signal indicative of one of three, leading, in-phase and lagging-behind, states.

3. The transmission timing adjusting circuit according to claim 1, wherein:

the phase correction circuit includes a first frequency division circuit for receiving the self-running clock and outputting a first frequency division clock, a second frequency division circuit for receiving the self-running clock and outputting a second frequency division clock, a flip-flop group for generating a plurality of phase adjustment clocks equal in frequency to one another and different in phase from one another on the basis of the outputs of the first and second frequency division circuits, and a selector for receiving the plurality of phase adjustment clocks and selectively outputting one thereof;

the first and second frequency division clocks being set in frequency to one another;

one of the phase adjustment clocks being selected as a result of the phase comparison and outputted as the transmission clock.

4. The transmission timing adjusting circuit according to claim 3, wherein the first and second frequency division clocks are at double the frequency of the frequency division clock.

5. The transmission timing adjusting circuit according to claim 1, wherein the phase correction circuit starts the control according to a trigger signal.

6. The transmission timing adjusting circuit according to claim 4, wherein:

the phase correction circuit includes an up-down counter for receiving the phase comparison result, the trigger signal and the transmission clock, and a delay means for delaying the output of the up-down counter;

the up-down counter being caused to up-count the phase comparison result when the result is leasing phase data, being caused to down-count the result when the result is lagging phase data, and being held inoperative when the result is in-phase data;

the selector selectively providing one of the phase adjustment clocks as the transmission clock according to the output of the delaying means.

7. The transmission timing adjusting circuit according to claim 6, wherein the delay means is a flip-flop.

8. A transmission timing adjusting method comprising steps of:

comparing, the phases of a reception clock and a transmission clock on the basis of the reception clock, the transmission clock and a self-running clock having higher frequency than that of the reception clock; and controlling the phase of the transmission clock on the basis of the phase comparison circuit for outputting the controlled transmission clock and a frequency division clock of the self-running clock.

* * * * *